United States Patent [19]
North et al.

[11] Patent Number: 6,131,650
[45] Date of Patent: Oct. 17, 2000

[54] FLUID COOLED SINGLE PHASE HEAT SINK

[75] Inventors: Mark T. North; John H. Rosenfeld, both of Lancaster; David L. Muth; Brian D. Fritsch, both of Columbia; C. Scott Schaeffer, Ephrata, all of Pa.

[73] Assignee: Thermal Corp., Georgetown, Del.

[21] Appl. No.: 09/357,226

[22] Filed: Jul. 20, 1999

[51] Int. Cl.$^7$ .................................................. F28F 7/00
[52] U.S. Cl. ........................ 165/170; 165/185; 165/907
[58] Field of Search .................................. 165/170, 907, 165/80.3, 80.4, 80.2; 361/695, 696, 697, 704, 710

[56] References Cited

U.S. PATENT DOCUMENTS

| | | | |
|---|---|---|---|
| 3,364,951 | 1/1968 | Burne et al. | 165/130 |
| 4,758,926 | 7/1988 | Herrell et al. | 361/385 |
| 4,896,719 | 1/1990 | O'Niell et al. | 165/170 |
| 4,898,234 | 2/1990 | McGovern et al. | 165/170 |
| 5,002,122 | 3/1991 | Sarraf et al. | 165/104.26 |
| 5,099,910 | 3/1992 | Walpole et al. | 165/80.4 |
| 5,105,429 | 4/1992 | Mundinger et al. | 372/34 |
| 5,107,091 | 4/1992 | Wagner et al. | 219/121.84 |
| 5,145,001 | 9/1992 | Valenzuela | 165/164 |
| 5,205,353 | 4/1993 | Willemsen et al. | 165/170 |
| 5,267,611 | 12/1993 | Rosenfeld | 165/168 |
| 5,727,618 | 3/1998 | Mundinger et al. | 165/80.4 |

OTHER PUBLICATIONS

J.M. Rosenfeld and M.T. North, "Porous Media Heat Exchangers for Cooling of High–power Optical Components", Optical Engineering, vol. 34, No. 2, pp 335 (Feb. 1995).

J.H. Rosenfeld, J.E. Lindemuth, M.T. North, and R.H. Goulding, "Innovative Technologies For Faraday Shield Cooling", 16th IEEE/NPSS Symposium, Oct. 1, 1995.

*Primary Examiner*—Allen Flanigan
*Attorney, Agent, or Firm*—Martin Fruitman

[57] ABSTRACT

The apparatus is an easily assembled, fluid cooled, single phase heat sink. The heat sink is constructed of only four simple parts, a pan shaped casing, a simple thermally conductive porous pad, a manifold block with channels, and a lid. The lid includes input and output fluid holes which are interconnected to sets of alternating channels in the manifold block, so that adjacent channels are isolated from each other and are connected to only either the input or the output holes. Thus, the only access between the adjacent input and output channels is through the porous pad which is sandwiched between the manifold block and the bottom of the casing. Fluid flow through the porous pad thereby cools the entire bottom of the casing which is held in heat transfer relationship with a heat source.

17 Claims, 4 Drawing Sheets

FLUID COOLED SINGLE PHASE HEAT SINK

BACKGROUND OF THE INVENTION

This invention deals generally with heat transfer from a high power density surface, and more specifically with a structure for cooling such a surface by means of a porous layer through which liquid or gas is pumped.

Cooling a high power density surface, that is, a surface to which intense heat is being delivered, is a particularly difficult problem. If the heat is delivered to the surface in multiple locations, or generally across the entire surface, the heat removal must similarly be over the entire surface. In the simplest configurations, such as with liquid flowing through cooling pipes attached to the backside of the heated surface, just the thermal resistance through the heated surface between the heat input point and the heat removal pipe can permit the surface temperature to rise too high.

Even with the use of evaporation cooling it is difficult to accomplish reliable cooling of such a surface. One reason is that high heat input at one location can create a high vapor pressure at that point and prevent additional liquid from reaching that location for generation of additional cooling vapor. Such a situation can lead to destruction of the surface.

Although there have been some approaches to cooling a heated surface without the use of evaporation, they also have not proven entirely satisfactory. U.S. Pat. No. 5,727,618 by Mundinger et al suggests one typical approach for cooling a high power density surface of a laser diode array. That patent discloses channels in a solid plate adjacent to the heated surface. U.S. Pat. No. 5,205,353 by Willemsen et al discloses alternating complimentary wedge shaped channels formed in a porous layer, with fluid fed into every other channel and out the channels between the input channels.

Such channeled designs suffer from several shortcomings. Those with solid channels such as Mundinger et al are easier to manufacture, but only directly cool the portions of the heated surface in contact with the fluid channels. The balance of the heated surface must conduct heat through the heated structure to reach the portions in contact with the fluid in the same manner as is required for attached pipes.

Those designs, such as Willemsen et al, which have channels in porous materials, are difficult and expensive to manufacture. Furthermore, they only supply a limited quantity of additional fluid in contact with the heated surface. They only add the cooling fluid flowing through the portion of the porous layer in direct contact with the heated surface to the amount which would be supplied by channels in adjacent solid material. Fluid passing through the porous material only a small distance removed from the heated surface adds little to the heat transfer from the heated surface.

It would be very advantageous to have a cooler which supplied fluid to the entire heated surface and yet was simple to manufacture.

SUMMARY OF THE INVENTION

The present invention uses a different structure for delivery of a liquid or gas coolant to a heated surface. Although the difference from designs such as that of Mundinger are subtle, the operational difference is clear, and the cooling is substantially improved.

The preferred embodiment of the invention is an easily assembled single phase heat sink which uses a simple pad of porous metal rather than a more complex porous structure with channels formed within it. The heat sink is constructed of only four simple parts, a pan shaped casing, a pad of porous metal, a solid manifold block with channels, and a lid.

The pan shaped housing is generally a rectangular prism with a solid bottom and slightly rounded internal corners. The thin solid bottom is the surface which is placed into a heat transfer relationship with a heat generating structure, such as a laser diode assembly.

The porous pad covers the entire bottom of the pan. It is thin enough so that virtually all the fluid flowing through it is affected by the heat flowing through the bottom of the pan.

The manifold block contacts the surface of the porous pad opposite from the surface of the pad in contact with the bottom of the pan. The manifold block has multiple channels within it with alternating channels arranged into two sets, the input and output channels. The sets open onto opposite ends of the block, and the channels of each set are closed at the ends remote from their openings, so that adjacent channels are isolated from each other and are connected only to openings at opposite ends of the manifold block.

The lid includes fluid access holes which supply fluid to and remove it from the open ends of the two sets of alternating channels in the manifold block. A barrier attached to the lid spaces the lid from the manifold block and forms two isolated chambers which interconnect with the open ends of the channels. Thus, the only access between the adjacent input and output channels in the manifold block is through the porous pad which is sandwiched between the manifold block and the bottom of the casing. All the fluid flow must therefore go through the porous pad and is in contact with and thereby cools the entire bottom surface of the bottom of the pan which is held in contact with or in close proximity to the heat source.

This simple construction requires channels in only the metal manifold block and the manufacture of only a simple pad of porous material, but it yields better heat transfer than either the channeled solid material or the channeled porous material of the prior art.

DETAILED DESCRIPTION OF THE INVENTION

Figure 1:
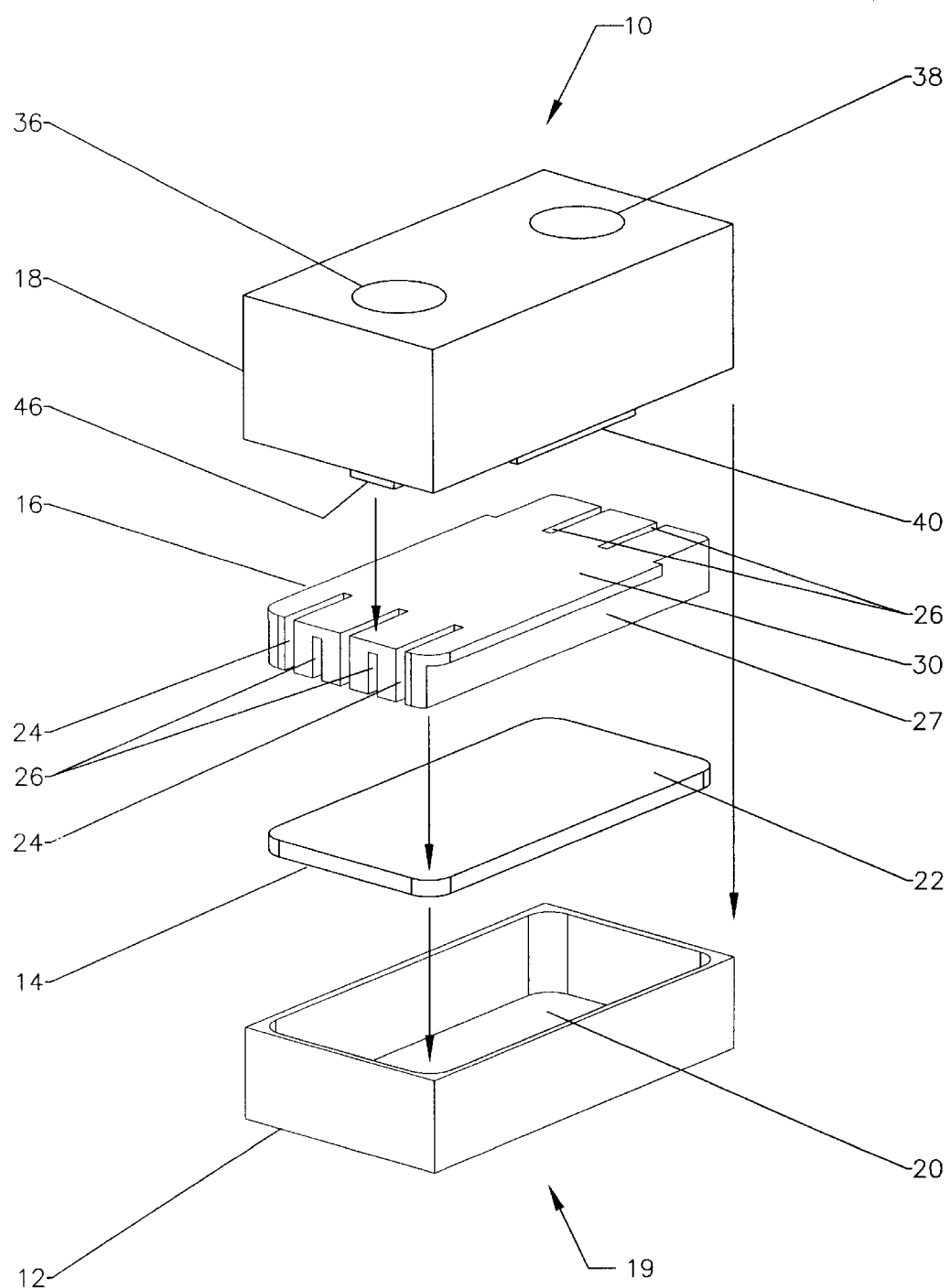
FIG. 1 is an exploded perspective view of the single phase heat sink of the preferred embodiment of the invention.

FIG. 1 is an exploded perspective view of single phase heat sink 10 of the preferred embodiment of the invention. Heat sink 10 is constructed with only four major parts, pan 12, porous pad 14, manifold block 16, and lid 18.

Pan 12 functions as the casing of heat sink 10 and in the preferred embodiment is shaped generally as a rectangular prism with slightly rounded internal corners, although the shape of the enclosed volume of pan 12 is not critical. The shape is actually determined by the configuration of the heat source which is to be cooled by outside surface 19 of bottom 20 of pan 12. Bottom 20 is a thin solid structure and is the surface which is placed into a heat transfer relationship with a heat generating source, such as a laser diode assembly (not shown). Bottom 20 should therefore be a good heat conductor, and a 0.4 mm thick copper sheet is used in the preferred embodiment.

However, depending upon the application in which heat sink 10 is to be used, a further advantage can be derived from using other materials. For example, heat sink 10 can be used to cool laser diode assemblies which are usually assembled by attachment to a ceramic base such as beryllium oxide to provide electrical insulation and and thermal conductivity to the attached heat sink. In such an application, bottom 20, and even entire pan 10, can be constructed of beryllium oxide or some other material with suitable electrical insulation and thermal conductivity characteristics. Pan 12 can then be used directly as the laser diode base, with the laser diode assemblies attached to heat sink 10 by bonding them to outside surface 19 of bottom 20. Such an arrangement eliminates the thermal resistance of the interface between the usual laser diode base and the conventional metal bottom of heat sink 10, and it also eliminates the thermal resistance contributed by the conduction across the thickness of conventional metal bottom 20.

Porous pad 14 covers the entire interior bottom 20 of the pan. Porous pad 14 is thin enough so that virtually all the fluid flowing through it is affected by the heat flowing through bottom 20 of pan 12. In the preferred embodiment pad 14 is 0.8 mm thick and constructed of sintered copper powder with a grain size in the range between 0.21 mm and 0.25 mm. Pad 14 is constructed with a 60 percent density of copper. In order to assure good heat transfer, porous pad 14 is bonded to inner surface 19 of pan bottom 20. In the preferred embodiment this bond is accomplished by brazing, but it is also practical to sinter the porous pad directly onto bottom surface 19, and other bonding methods are also possible.

Figure 2:
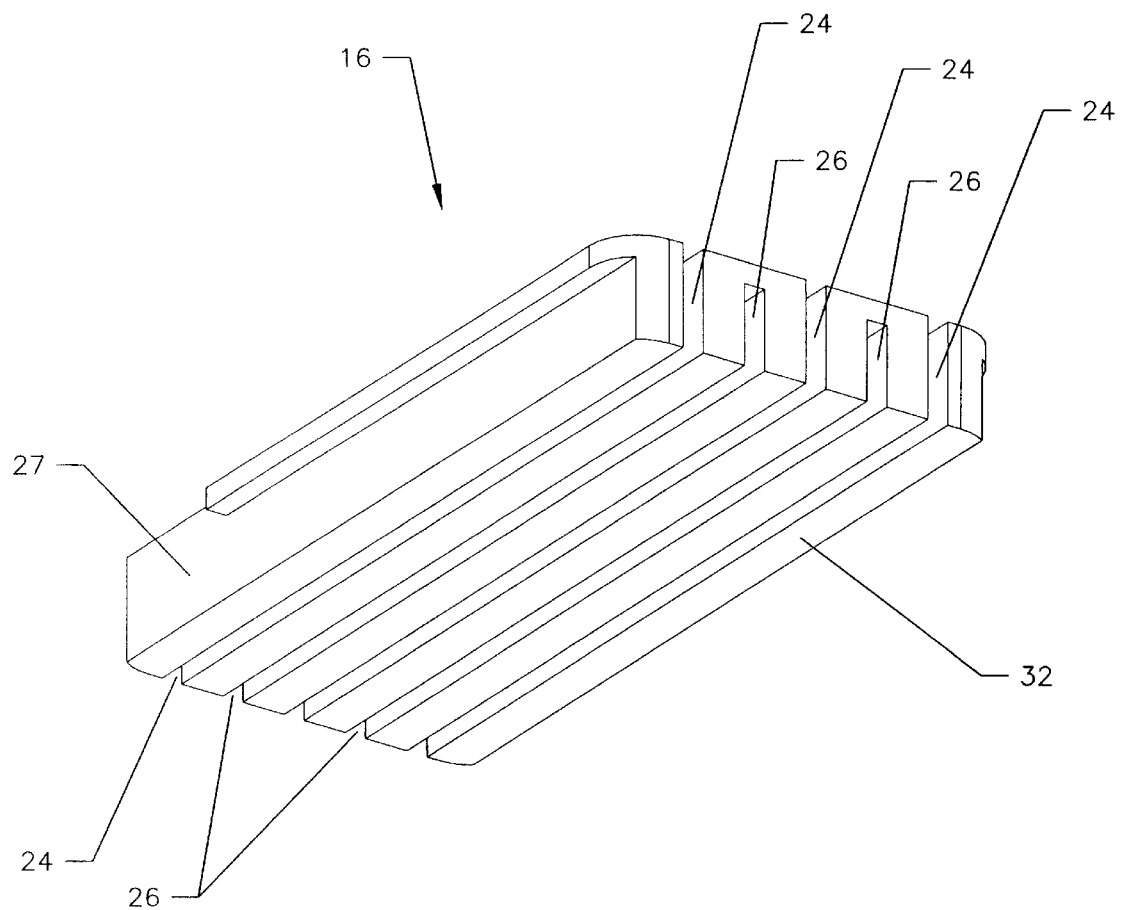
FIG. 2 is a perspective view of the manifold block of the preferred embodiment of the invention showing the side with the channels.

The fluid flowing through pad 14 essentially flows in paths parallel to the plane of pad 14 because of the configuration of manifold block 16. FIG. 2 is a perspective view of manifold block 16 of the heat sink 10 showing surface 32 with channels 24 and 26. Surface 32 is the surface opposite from surface 30 seen in FIG. 1. Surface 32 of manifold block 16 contacts surface 22 of porous pad 14 which is opposite from the surface of pad 14 which is in contact with the inner surface of bottom 20 of pan 12. When installed in pan 12 the entire lengths of multiple channels 24 and 26 which are formed within manifold block 16 all open onto surface 22 of pad 14.

The two sets of channels, 24 and 26, are composed of alternating channels, and, as seen in FIG. 1, the sets of channels open onto opposite ends of surface 30 of manifold block 16. When manifold block 16 is installed into pan 12 all the vertical openings of both sets of the channels are closed off. Thus, adjacent channels are isolated from each other and are connected only to openings at opposite ends of surface 30 of manifold block 16. It should also be appreciated that long sides 27 of manifold block 16 also form additional channels for set 26 once manifold block 16 is inserted into pan 12 because the long sides of pan 12 form one wall of each of these channels.

Figure 3:
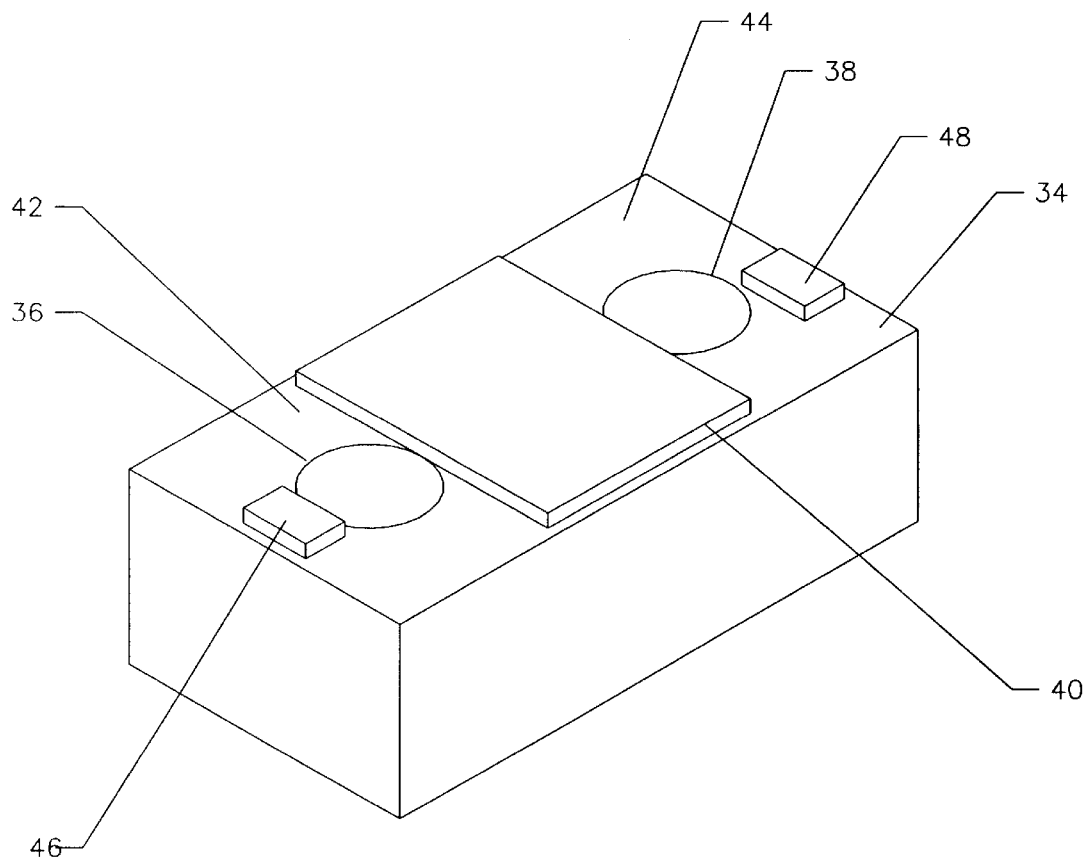
FIG. 3 is a perspective view of the lid of the preferred embodiment of the invention showing the surface which contacts the manifold block.

FIG. 3 is a perspective view of lid 18 of the preferred embodiment of heat sink 10 showing surface 34 which faces manifold block 16 when heat sink 10 is assembled. Lid 18 includes fluid access holes 36 and 38, each of which connects to one of two isolated chambers 42 and 44 formed when lid 18 is assembled into heat sink 10. Barrier 40 both spaces lid 18 from surface 30 of manifold block 16 to form chambers 42 and 44 and isolates the two chambers from each other. Spacers 46 and 48 are also attached to surface 34 of lid 18 to stabilize lid 18.

When heat sink 10 is assembled by moving and bonding the parts together as indicated by the directional arrows in FIG. 1, heat sink 10 operates in a very simple manner. With fluid fed into either access hole 36 or 38 by pipes (not shown) attached to them by conventional means, fluid entering, for instance, pipe 36 enters chamber 42 and then into channels 24. With channels 24 filled with fluid, the fluid pressure pushes fluid through porous pad 14, the only exit from channels 24. The fluid then moves through pad 14 into channels 26, located on both sides of channels 24. Traveling this path, fluid moves through the entire volume of pad 14 and in close thermal contact with bottom 20 of pan 12 to provide excellent cooling of any apparatus in contact with bottom 20. The fluid then exits channels 26 into chamber 44 and out of lid 18 through hole 38.

Figure 4:
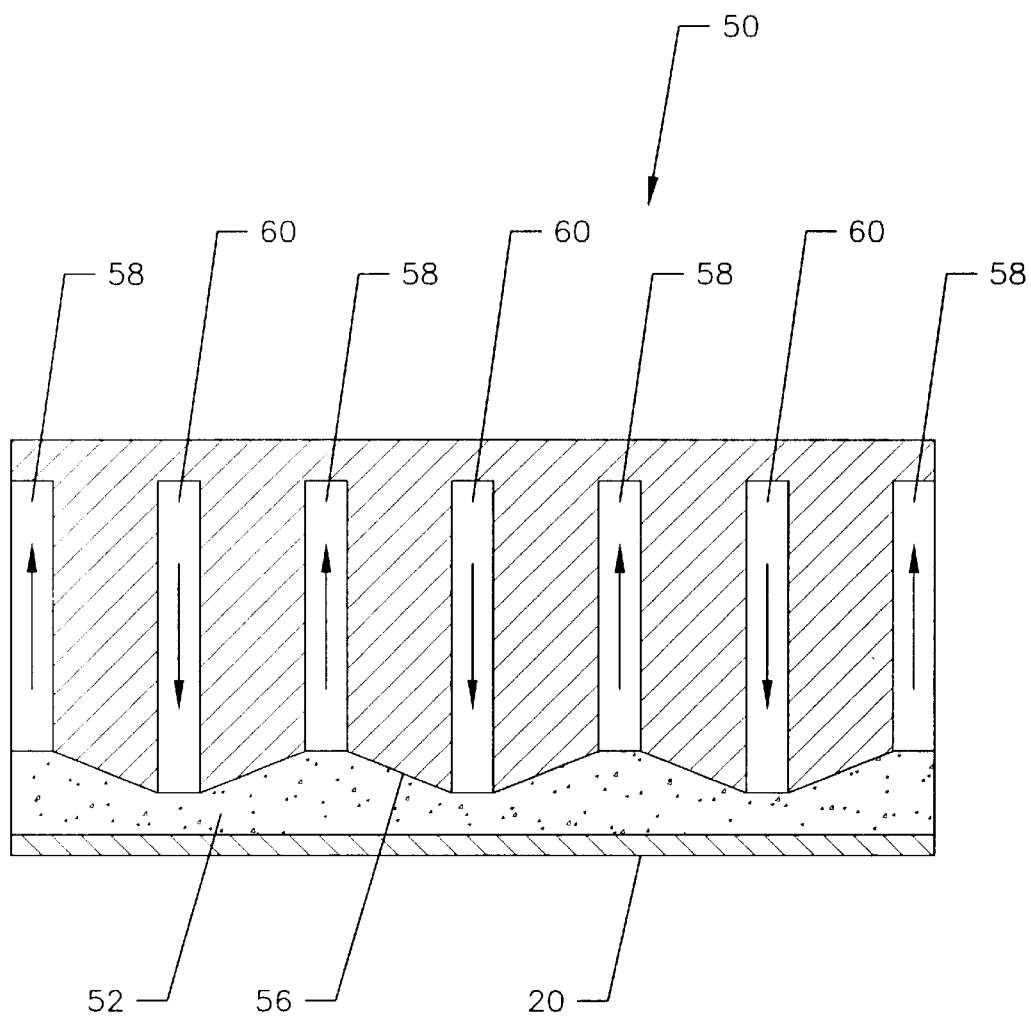
FIG. 4 is a cross section view across the channels of an alternate embodiment of the invention with modifications of the manifold and porous pad.

FIG. 4 is a cross section view across the channels of an alternate embodiment 50 of the invention with modifications of the manifold block and porous pad which create a more uniform temperature across pan bottom 20. Porous pad 52 and manifold block 54 have mating sawtooth shaped surfaces at junction 56, and this configuration creates variations in the thickness of porous pad 52. Thus, as indicated by the arrows, liquid flows into porous pad 52 from input channels 58 at the thicker portion of porous pad 52 and out through channels 60 at the thinner portion of porous pad 52.

This variation in the cross section area of the liquid flow path through porous pad 52 causes a variation in the velocity of the liquid flowing through porous pad 52, so that the liquid flow increases velocity as it moves toward output channels 60. This increase in velocity means that when the liquid is coolest, as it enters porous pad 52, it will be moving slowest, and when the liquid is the warmest, as it leaves porous pad 52, it will be moving the fastest. Such an increase in velocity compensates for the poorer heat transfer which would otherwise result because of the smaller temperature difference between the heat source and the cooling liquid near the output, and the variation in the thickness of porous pad 52 thereby provides a more uniform temperature across both pan bottom 20 and the heat source being cooled.

The heat sink of the present invention thereby provides improved cooling of heat generating devices, although it is constructed of a minimum number of simple parts.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example various attachment holes and fixtures can be attached to lid 18 or pan 12, and fluid access holes could be located on other surfaces of lid 18. Moreover, porous pad 14 can be constructed with different materials such as ceramic, with different structures such as screen, metal felt, and foamed metal, or with particles bonded together by methods other than sintering.

What is claimed as new and for which Letters Patent of the United States are desired to be secured is:

1. A cooler for a heat source comprising:
   an enclosure;
   a heat conducting structure attached to the enclosure with a first surface in heat transfer relationship with a heat source and a second surface within the enclosure;

a porous pad within the enclosure in contact with the second surface of the heat conducting structure;

a manifold structure within the enclosure with channels formed in a first surface which is in contact with the porous pad and the channels are divided into at least two sets so that adjacent channels are in different sets;

at least two fluid access means located within the enclosure, separated from each other, and each interconnected to a set of channels;

a lid attached to the enclosure, the lid including two fluid access holes into the enclosure, with each hole interconnected with a different fluid access means; and fluid furnished to a first fluid access hole and flowing into a first fluid access means, through a first set of channels, through the porous pad to a second set of channels, through the second set of channels, through a second fluid access means, and out a second fluid access hole.

2. The cooler of claim 1 wherein the enclosure is shaped as a pan.

3. The cooler of claim 1 wherein the enclosure is shaped as a pan and the heat conducting structure forms the bottom of the pan.

4. The cooler of claim 1 wherein the heat conducting structure is constructed of copper.

5. The cooler of claim 1 wherein the heat conducting structure is constructed of a heat conductive and electrically insulating material.

6. The cooler of claim 1 wherein the heat conducting structure is constructed of ceramic.

7. The cooler of claim 1 wherein the heat conducting structure is constructed of beryllium oxide.

8. The cooler of claim 1 wherein the enclosure is constructed of ceramic.

9. The cooler of claim 1 wherein the porous pad is a planar structure.

10. The cooler of claim 1 wherein the porous pad is constructed of a thermally conductive material.

11. The cooler of claim 1 wherein the porous pad is constructed of sintered metal powder.

12. The cooler of claim 1 wherein the porous pad is constructed of sintered copper powder.

13. The cooler of claim 1 wherein the porous pad is bonded to the heat conducting structure.

14. The cooler of claim 1 wherein the porous pad is constructed with a reduction of cross sectional area between the fluid input channels and the fluid output channels.

15. The cooler of claim 1 wherein the fluid access means are chambers separated by barrier means located between the manifold structure and the lid, and the barrier means separates the manifold structure from the lid.

16. The cooler of claim 1 wherein the fluid access holes are located in the surface of the lid opposite from the fluid access means.

17. The cooler of claim 1 wherein the channels within the manifold structure are parallel to each other.

* * * * *